(12) United States Patent
Kim

(10) Patent No.: US 7,409,018 B2
(45) Date of Patent: Aug. 5, 2008

(54) AUTOMATIC GAIN CONTROLLER OUTPUTTING CONTROL VALUE VARYING NONLINEARLY, AND A METHOD OF OUTPUTTING A GAIN CONTROL SIGNAL THEREOF

(75) Inventor: Joon-soo Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 783 days.

(21) Appl. No.: 10/124,261

(22) Filed: Apr. 18, 2002

(65) Prior Publication Data
US 2003/0123581 A1 Jul. 3, 2003

(30) Foreign Application Priority Data
Jan. 2, 2002 (KR) .................................. 2002-115

(51) Int. Cl.
*H04L 27/08* (2006.01)
*H03G 3/20* (2006.01)

(52) U.S. Cl. ..................................... 375/345; 455/239.1

(58) Field of Classification Search ................. 375/345, 375/316; 455/239.1, 240.1, 136, 138, 234.1, 455/232.1; 330/278, 279, 280; 348/725, 348/528, 678
See application file for complete search history.

(56) References Cited

U.S. PATENT DOCUMENTS

| | | | | |
|---|---|---|---|---|
| 3,667,043 A | * | 5/1972 | Ahlgren ........................ 455/17 |
| 3,745,571 A | * | 7/1973 | Chwastyk et al. ............. 342/194 |
| 3,810,177 A | * | 5/1974 | Tabourier ...................... 342/92 |
| 4,334,185 A | * | 6/1982 | Turney et al. ................. 323/280 |
| 4,498,036 A | * | 2/1985 | Salemka ....................... 318/561 |
| 5,068,591 A | * | 11/1991 | Hoegberg et al. .............. 322/29 |
| 5,222,078 A | * | 6/1993 | Cason et al. .................. 375/319 |
| 5,222,250 A | * | 6/1993 | Cleveland et al. .............. 455/47 |
| 5,448,424 A | * | 9/1995 | Hirano et al. .................. 360/65 |

(Continued)

FOREIGN PATENT DOCUMENTS

CN 1314032 A 9/2001

(Continued)

OTHER PUBLICATIONS

Popken et al., "Statistical Description of Non-Coherent Automatic Gain Control", IEEE Conference, Singapore ICCS/ISITA '92, 'Communications on the Move', Nov. 16-20, 1992, pp. 133-136 vol. 1.*

*Primary Examiner*—Mohammad Ghayour
*Assistant Examiner*—Vineeta Panwalkar
(74) *Attorney, Agent, or Firm*—Staas & Halsey LLP

(57) ABSTRACT

An automatic gain controller having an estimator to estimate the level of an input signal, a subtractor to calculate a difference between the level estimated by the estimator and a predetermined reference value, a gain controller to output a control value achieved by scaling non-linearly the difference output by the subtractor, an accumulator to accumulate the output of the gain controller, and a modulator to modulate the output of the accumulator to a pulse width modulated signal. The gain controller outputs the control value proportional to a square of the difference. If en error between the power of the input signal and the reference value is great, the power can be quickly adjusted to a desired signal level, and if the error is small, the gain can be controlled finely.

10 Claims, 3 Drawing Sheets

U.S. PATENT DOCUMENTS

| | | | |
|---|---|---|---|
| 5,469,115 A * | 11/1995 | Peterzell et al. | 330/129 |
| 5,627,857 A * | 5/1997 | Wilson | 375/219 |
| 5,710,799 A * | 1/1998 | Kobayashi | 375/349 |
| 5,784,410 A * | 7/1998 | Nakano | 375/345 |
| 5,959,505 A * | 9/1999 | Ushiyama | 331/158 |
| 5,960,091 A * | 9/1999 | White et al. | 381/98 |
| 6,166,850 A * | 12/2000 | Roberts et al. | 359/341.2 |
| 6,268,972 B1 * | 7/2001 | Philpott et al. | 360/46 |
| 6,351,529 B1 * | 2/2002 | Holeva | 379/395 |
| 6,459,458 B1 * | 10/2002 | Balaban | 348/678 |
| 6,556,685 B1 * | 4/2003 | Urry et al. | 381/94.1 |
| 6,678,010 B2 * | 1/2004 | Jun | 348/678 |
| 6,959,082 B1 * | 10/2005 | Holeva | 379/388.03 |

FOREIGN PATENT DOCUMENTS

| | | |
|---|---|---|
| DE | 559 472 | 2/1975 |
| JP | 3-55194 | 5/1991 |
| JP | 5-2420 | 1/1993 |
| JP | 2001-251256 | 9/2001 |

* cited by examiner

AUTOMATIC GAIN CONTROLLER OUTPUTTING CONTROL VALUE VARYING NONLINEARLY, AND A METHOD OF OUTPUTTING A GAIN CONTROL SIGNAL THEREOF

CROSS-REFERENCE TO RELATED APPLICATIONS

This application claims the benefit of Korean Patent Application No. 2002-115 filed on Jan. 2, 2002, in the Korean Industrial Property Office, the disclosure of which is incorporated herein by reference.

BACKGROUND OF THE INVENTION

1. Field of the Invention

The present invention relates to an automatic gain controller, and more particularly, to an automatic gain controller outputting a gain control signal to automatically control a signal gain inputted into a signal receiver such as a digital television.

2. Description of the Related Art

A signal receiver such as a digital television has an automatic gain controller to control the gain of the inputted signal. In case the power of the inputted signal is either excessive or low, it is difficult to properly control the signal and therefore the automatic gain controller automatically adjusts the gain of the inputted signal to an appropriate level.

The automatic gain control is necessary particularly in digital communication. In the digital communication, an analog-to-digital converter samples an analog signal passed through a radio frequency channel, and the digitalized signal undergoes a digital signal processing. When an analog signal is digitalized, an input signal needs to have a sufficient amount of power in order to minimize quantizing noise. However, if the power of the signal input is excessive, the AD converter becomes saturated and a circuit processing a digital signal causes mis-operation. Therefore, the level of the input signal should be adjusted to a certain level.

The automatic gain controller is necessary not only for a digital television but for all communication devices including a mobile communication device, etc. FIG. 1 illustrates a conventional automatic gain controller, and more particularly, an automatic gain controller used for digital communication.

As illustrated in FIG. 1, a conventional automatic gain controller comprises a power estimator 11, a subtractor 13, a gain multiplier 15, an accumulator 20, and a modulator 30.

The power estimator 11 receives a digital signal outputted from an AD converter and estimates the power of the input signal. The subtractor 13 calculates the value of a difference between the power estimated by the power estimator 11 and a predetermined reference value, i.e., an error of the signal power. The calculated difference value is inputted into the gain multiplier 15 which multiplies the difference value by a constant gain K. The constant gain K multiplied by the value of the difference between the reference value and the actual power of an input signal determines the bandwidth of the automatic gain controller.

The accumulator 20 comprises a delay unit 23 to delay the signal input and an adder 21 to add the output of the delay unit 23 and the output of the gain multiplier 15 and input the outcome into the delay unit 23. The output value of the gain multiplier 15 is accumulated by the accumulator 20.

The modulator 30 modulates the output value of the accumulator 20. A Σ-Δ DA converter generating a pulse width modulation signal corresponding to the output of the accumulator 20 is used as a modulator 30. The output of the modulator 30 is provided to other parts in a signal receiver, such as an IF amplifier or an RF amplifier requiring a gain control signal.

However, the above conventional automatic gain controller has a problem that the signal level of the input signal might not be properly adjusted when the status of the channel receiving the input signal changes too much since the gain value K controlling bandwidth is fixed. For example, as illustrated in FIG. 2, if the gain value K is set too low (K<1), it is difficult to follow the change of the input signal as the gain of the automatic gain controller becomes low, and if the gain value K is set too high (K>1), a jitter occurring at the state of the input signal being stably received may become high because the gain of the automatic gain controller becomes high.

SUMMARY OF THE INVENTION

Accordingly, it is an object of the present invention to provide an automatic gain controller that is able to quickly adjust the power of the input signal to a desired signal level by letting the controller have a large gain value when a difference between the input signal power and the reference value is great, and also able to control the gain finely by letting the controller have a small gain value when the difference is small.

Additional objects and advantages of the invention will be set forth in part in the description which follows and, in part, will be obvious from the description, or may be learned by practice of the invention.

The foregoing and other objects of the present invention are achieved by providing that the automatic gain controller includes an estimator to estimate the level of a signal input, a subtractor to calculate a difference between the level estimated by the estimator and a predetermined reference value, and a gain controller to output a control value achieved by nonlinearly scaling the difference output from the subtractor.

The gain controller comprises a first multiplier to multiply a predetermined constant gain by the difference from the subtractor, an absolute value calculator to calculate an absolute value of the difference, and a second multiplier to output the control value by multiplying the output of the first multiplier by the output of the absolute value calculator. Then, the gain controller outputs the control value proportional to the square of the difference.

Meanwhile, the automatic gain controller according to the present invention has an accumulator to calculate accumulated values of the control value output by the gain controller, and a modulator to generate a modulated signal corresponding to the accumulated value outputted by the subtractor. The signal outputted by the modulator is provided to the device in need of a gain control signal, such as an IF amplifier.

According to the present invention, if an error between the power of the input signal and the reference value is great, the power can be quickly adjusted to a desired signal level, and if an error is small the gain can be controlled finely.

The foregoing and other objects of the present invention may also be achieved by providing a method of outputting a gain control signal of an automatic gain controller, which comprises: estimating the level of a signal input, calculating a difference between the level estimated and a predetermined reference value, and outputting a control value by nonlinearly scaling the calculated difference between the level estimated and the predetermined reference value.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
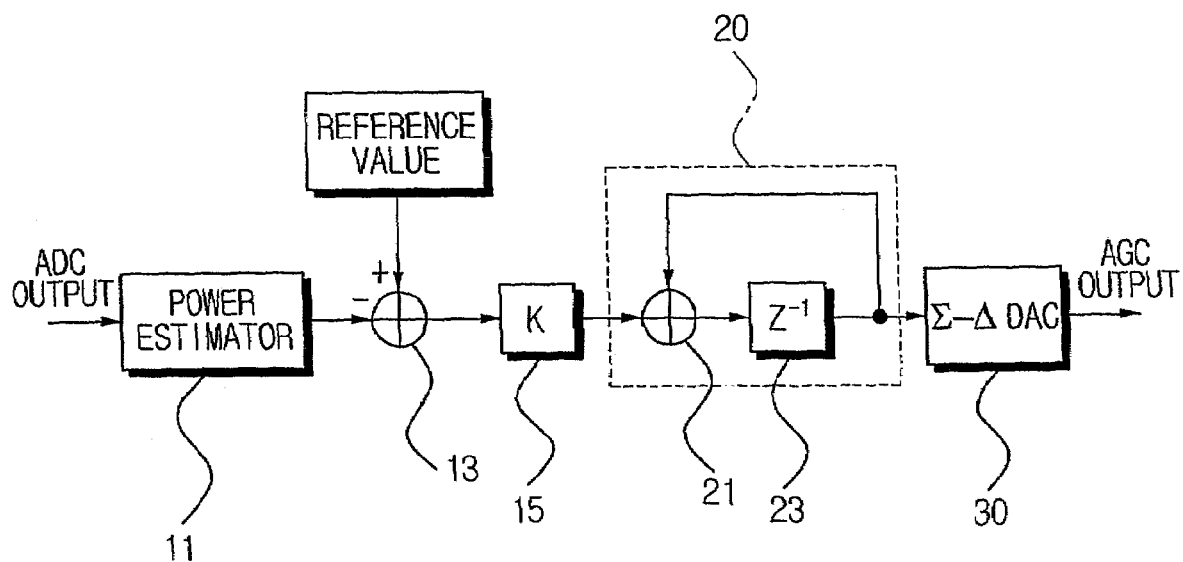
FIG. 1 is a block diagram of a conventional automatic gain controller.
Figure 2:
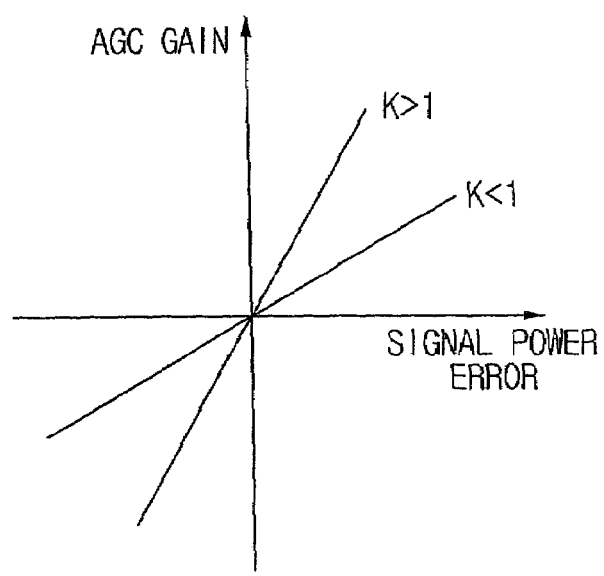
FIG. 2 is a graph illustrating the output of the automatic gain controller provided in FIG. 1.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 3:
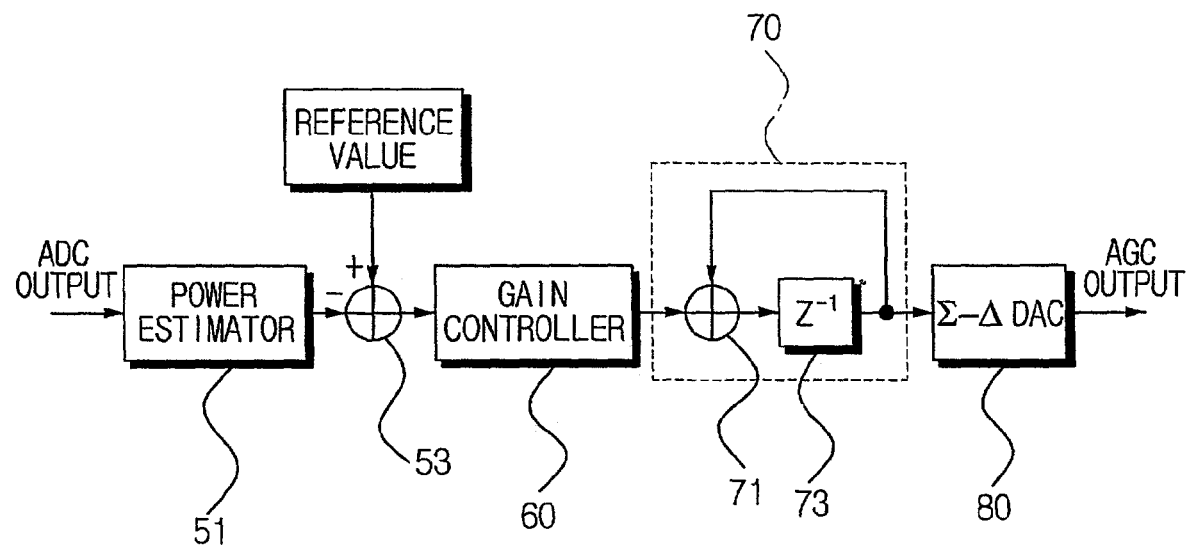
FIG. 3 is a block diagram of an automatic gain controller according to an embodiment of the present invention.
Figure 4:
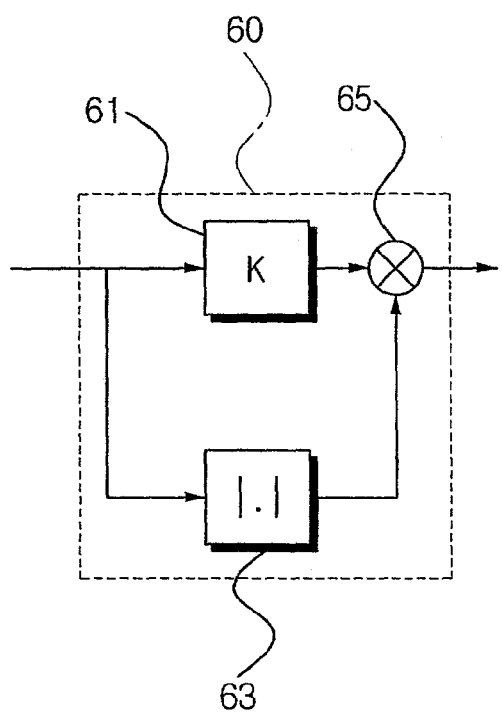
FIG. 4 is a block diagram illustrating the detailed construction of the gain controller provided in FIG. 3.

FIG. 3 is a block diagram of an automatic gain controller according to an embodiment of the present invention, and FIG. 4 is a block diagram illustrating a detailed construction of the gain controller in FIG. 3. In the present embodiment, an automatic gain controller outputting a gain control signal for a digital signal is provided.

A signal received through an external channel is converted to a digital signal by an AD converter (not shown) and the converted digital signal is inputted into the automatic gain controller according to this embodiment of the present invention.

The automatic gain controller comprises a power estimator 51, a subtractor 53, a gain controller 60, an accumulator 70, and a modulator 80.

The power estimator 51 receives a digital signal outputted by an AD converter and estimates the power of the input signal. The power of the input signal can be calculated either by using a square value of the input signal or simply by adopting an absolute value of the input signal.

The output of the power estimator 51 and a predetermined reference value are inputted into the subtractor 53. The reference value is set to a certain value that is calculated under the assumption that the input signal has a normal distribution. The reference value is stored in a storage unit such as a register (not shown) and is changeable depending on the need. The subtractor 53 calculates a difference, i.e., an error of the power signal, between the power estimated in the power estimator 11 and the reference value. The calculated difference value is inputted into the gain controller 60.

The gain controller 60 is comprised of a first multiplier 61, a second multiplier 65 and an absolute value calculator 63 as illustrated in FIG. 4. Into the first multiplier 61 is input the difference outputted by the subtractor 53, and the first multiplier 61 multiplies a predetermined constant gain K by the difference. The difference outputted by the subtractor 53 is also inputted into the absolute value calculator 63, and the absolute value calculator 63 calculates the absolute value of the difference outputted by the subtractor 53. The second multiplier 65 multiplies the output of the first multiplier 61 by the output of the absolute value calculator 63, and the output of the second multiplier 65 becomes a control value outputted by the gain controller 60.

The output of the gain controller 60 having the above construction can be expressed by the following formula:

$$y(n) = Ke(n)\,|e(n)|$$
$$= Ke^2(n) \text{ (for } e(n) > 0)$$
$$= -Ke^2(n) \text{ (for } e(n) < 0)$$

In this formula, n is a sampling time for the digital input signal;

y(n) is the output of the gain controller 60;

K is a constant gain of the first multiplier 61; and e(n) is an error outputted by the subtractor 53.

As shown in the above formula, the gain controller 60 outputs the control value by nonlinearly scaling the inputted difference, and the outputted control value is proportional to the square of the difference outputted by the subtractor 53.

The accumulator 70 comprises a delay unit 73 to delay a signal input thereto, and an adder 71 to add the output of the delay unit 73 and the output of the gain controller 60 and input the output thereof to the delay unit 73. The delay unit 73 delays the signal input thereto as long as one sample period. Since the input of the delay unit 73 is the output of itself and the gain controller 60, the delay unit 73 consecutively accumulates the output of the gain controller 60. Therefore, the accumulator 70 accumulates every control value outputted by the gain controller 60, and then calculates the accumulated value.

The modulator 80 modulates the output value of the accumulator 70. A Σ-Δ DA converter to generate a pulse width modulation signal corresponding to the output of the accumulator 70 is preferably used as the modulator 80. Accordingly, the modulator 80 generates a pulse width modulation signal comprised of either a binary value of 1 or 0, and this signal becomes a final output of the automatic gain controller. The final output generated by the modulator 80 is provided to other parts by a signal receiver, such as an IF amplifier or an RF amplifier requiring a gain control signal.

Figure 5:
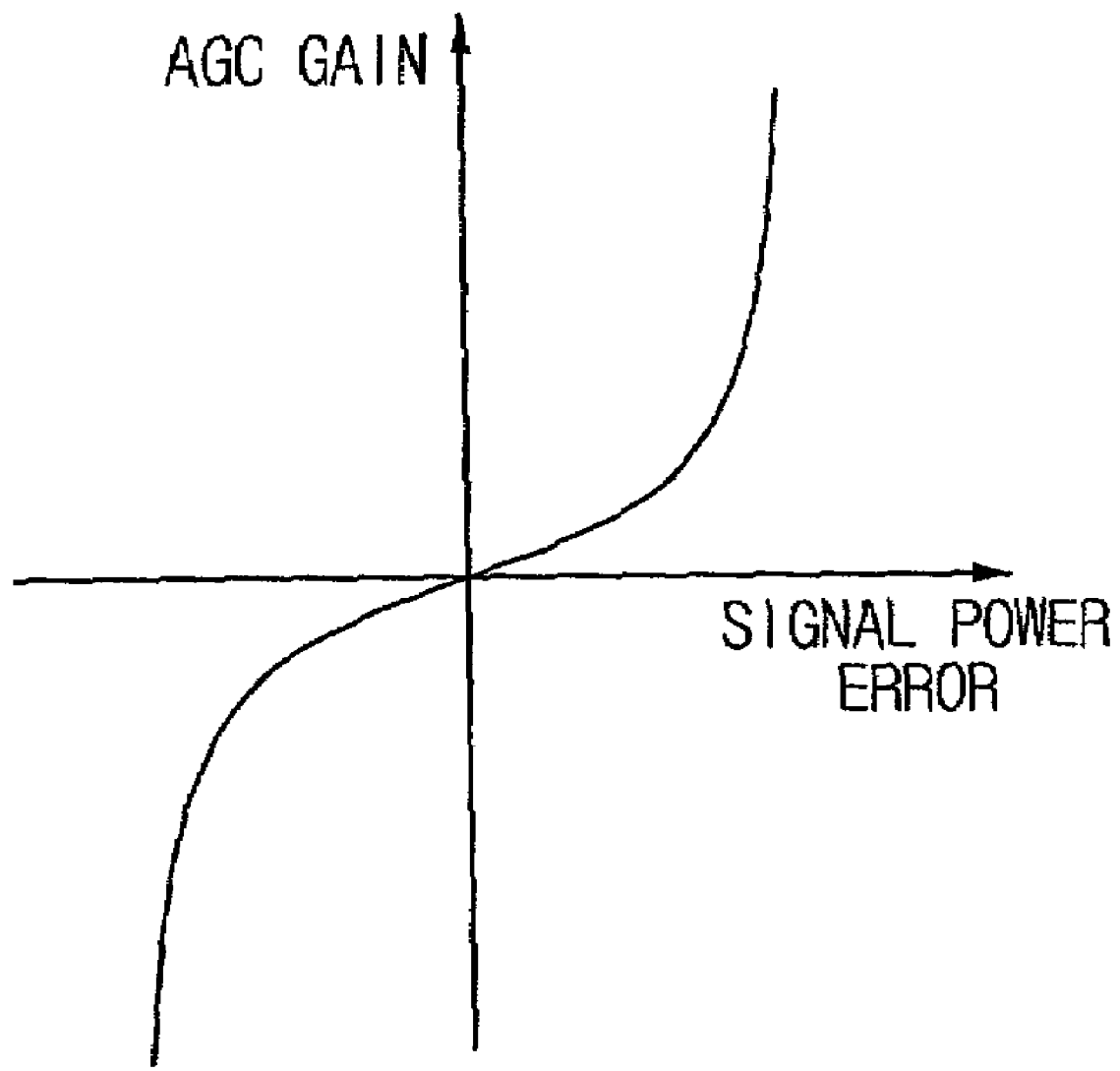
FIG. 5 is a graph illustrating the output of the automatic gain controller provided in FIG. 3.

FIG. 5 is a graph illustrating the output of the gain controller 60 indicated in the above formula. As illustrated in FIG. 5, the greater the value of the difference between the estimated level of the input and the predetermined reference value, which is an error of signal input power and the reference value, the greater the gain of the automatic gain controller is as a secondary function. Therefore, the level change of the signal input can be quickly followed and the movement of the signal receiver becomes quickly stabilized. In addition, the gain becomes smaller when the above difference value is small. As a result, fluctuation caused by an unnecessarily large gain does not occur in the signal level, and high jitter occurring at the state of the input signal being stably received is prevented.

The above embodiment explains an example of the control value proportional to a square of an error so as to quickly follow the level change of the input signal when the level of the input signal changes greatly. However, various methods may be applied to nonlinearly increase the control value as the value of an error increases. For example, one of the possible methods could be making the gain controller proportional to a cube of an error, or employing various circuits, in which the characteristics of the gain is changeable according to another nonlinear characteristic that can not be indicated in a specific formula.

As described above, according to the present invention, if an error between the power of the input signal and the reference value is great, the power can be quickly adjusted to a desired signal level, and if the error is small, the gain can be controlled finely.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An automatic gain controller comprising:
    an estimator to estimate a level of an input signal;
    a subtractor to calculate a difference between the level estimated by said estimator and a predetermined reference value; and
    a gain controller to output a control value by non-linearly scaling the difference output by said subtractor;
    wherein said pain controller comprises:
    a first multiplier to multiply a predetermined constant pain by the difference from said subtractor;
    an absolute value calculator to calculate an absolute value of the difference from said subtractor; and
    a second multiplier to output the control value by multiplying an output of said first multiplier by an output of said absolute value calculator.

2. The automatic gain controller according to claim 1, wherein the gain controller outputs the control value proportional to a square of the difference output by said subtractor.

3. The automatic gain controller according to claim 1, further comprising an accumulator to calculate an accumulated value of the control value output by said gain controller.

4. The automatic gain controller according to claim 3, wherein the accumulator comprises:
    a delay unit to delay a signal input thereto; and
    an adder to add an output of said delay unit and the control value output from said gain controller, and inputting an output thereof to said delay unit.

5. The automatic gain controller according to claim 3, further comprising a modulator to generate a modulated signal corresponding to the accumulated value output by said accumulator.

6. The automatic gain controller according to claim 1, wherein the output of said gain controller is expressed by the following:

$$y(n) = Ke(n)|e(n)|,$$
$$= Ke^2(n) \text{ (for } e(n) > 0\text{), and}$$
$$= -Ke^2(n) \text{ (for } e(n) < 0\text{);}$$

where n is a sampling time for the input signal;
y(n) is the output of the gain controller;
K is a constant gain of the first multiplier; and
e(n) is an error outputted by the subtractor.

7. The automatic gain controller according to claim 1, wherein the predetermined reference value is set based on a normal distribution of the input signal.

8. A method of outputting a gain control signal of a single automatic gain controller, the method comprising:
    estimating a level of an input signal;
    calculating a difference between the estimated input level and a predetermined reference value; and
    scaling the calculated difference non-linearly to output a control value which is proportional to be a cube of the calculated difference;
    wherein the single automatic gain controller is not a feedback automatic gain controller,
    wherein the scaling includes obtaining a first value by multiplying a predetermined constant gain by the difference;
    calculating an absolute value of the difference; and
    outputting a control value by multiplying the first value by the calculated absolute value of the difference.

9. The method of outputting the gain control signal according to claim 8, further comprising calculating an accumulated value of the control value.

10. The method of outputting the gain control signal according to claim 9, further comprising generating a modulated signal corresponding to the accumulated value.

* * * * *

UNITED STATES PATENT AND TRADEMARK OFFICE
CERTIFICATE OF CORRECTION

PATENT NO. : 7,409,018 B2 Page 1 of 1
APPLICATION NO. : 10/124261
DATED : August 5, 2008
INVENTOR(S) : Joon-soo Kim It is certified that error appears in the above-identified patent and that said Letters Patent is hereby corrected as shown below:

On the Title Page, Item (57) (Abstract), Line 10, change "en" to --an--.

Column 5, Line 25, change "pain" to --gain--.

Column 5, Line 26, change "pain" to --gain--.

Signed and Sealed this

Twenty-fifth Day of November, 2008

JON W. DUDAS
*Director of the United States Patent and Trademark Office*